United States Patent
Yap et al.

(10) Patent No.: US 10,319,689 B2
(45) Date of Patent: Jun. 11, 2019

(54) ANTENNA ASSEMBLY FOR WAFER LEVEL PACKAGING

(71) Applicant: FREESCALE SEMICONDUCTOR, INC., Austin, TX (US)

(72) Inventors: Weng Foong Yap, Chandler, AZ (US); Jinbang Tang, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 14/955,471

(22) Filed: Dec. 1, 2015

(65) Prior Publication Data

US 2017/0154859 A1  Jun. 1, 2017

(51) Int. Cl.
  *H01L 23/538* (2006.01)
  *H01L 23/66* (2006.01)
  *H01L 23/498* (2006.01)
  *H01L 23/552* (2006.01)

(52) U.S. Cl.
  CPC ........ *H01L 23/66* (2013.01); *H01L 23/49816* (2013.01); *H01L 23/5385* (2013.01); *H01L 23/5386* (2013.01); *H01L 23/5389* (2013.01); *H01L 23/552* (2013.01); *H01L 2223/6605* (2013.01); *H01L 2223/6677* (2013.01)

(58) Field of Classification Search
  CPC ......... H01L 2223/6677; H01L 23/5389; H01L 23/66; H01L 23/49816; H01L 23/5385; H01L 23/5386; H01L 2224/48227; H01L 2924/181; H01L 2224/131
  See application file for complete search history.

(56) References Cited

U.S. PATENT DOCUMENTS

| 8,222,538 | B1 | 7/2012 | Yoshida et al. | |
| 8,786,060 | B2 | 7/2014 | Yen et al. | |
| 8,917,151 | B2* | 12/2014 | Dayan | H01P 3/121 333/247 |
| 2009/0251357 | A1* | 10/2009 | Margomenos | G01S 7/032 342/70 |
| 2010/0309078 | A1* | 12/2010 | Rofougaran | H01Q 1/248 343/776 |
| 2011/0023289 | A1* | 2/2011 | Finn | G06K 19/07722 29/601 |
| 2013/0127018 | A1* | 5/2013 | Phua | H01L 24/96 257/620 |
| 2013/0154091 | A1 | 6/2013 | Wright et al. | |
| 2013/0265734 | A1* | 10/2013 | Herbsommer | G02B 6/12004 361/783 |
| 2013/0341784 | A1* | 12/2013 | Lin | H01L 24/19 257/737 |

(Continued)

OTHER PUBLICATIONS

Freescale, "Freescale's Redistributed Chip Packaging (RCP)", Int'l Microelectronics Assembly and Packaging Society (IMAP), Jan. 1, 2013, pp. 1-21.

*Primary Examiner* — Nathan W Ha

(57) ABSTRACT

Embodiments are provided for a packaged semiconductor device that includes a package substrate that in turn includes an embedded die configured to process a radio frequency (RF) signal; a printed circuit board (PCB) attached to a front side of the package substrate, where the PCB includes a cavity; and an antenna enabling element attached to the front side of the package substrate within the cavity, the antenna enabling element configured to convey the RF signal through the cavity.

22 Claims, 7 Drawing Sheets

(56) References Cited

U.S. PATENT DOCUMENTS

| | | | |
|---|---|---|---|
| 2014/0168014 A1* | 6/2014 | Chih | H01L 24/19 |
| | | | 343/700 MS |
| 2015/0061091 A1* | 3/2015 | Seler | H01L 24/19 |
| | | | 257/664 |
| 2015/0264814 A1* | 9/2015 | Hsu | H01L 21/485 |
| | | | 361/761 |
| 2015/0285998 A1* | 10/2015 | Babakhani | G02B 6/13 |
| | | | 438/27 |
| 2015/0333028 A1* | 11/2015 | Yap | H01L 24/14 |
| | | | 257/738 |
| 2016/0141213 A1* | 5/2016 | Bishop | H01L 24/19 |
| | | | 438/16 |
| 2016/0293557 A1* | 10/2016 | Topak | H01L 23/66 |
| 2017/0053874 A1* | 2/2017 | Renaud-Bezot | |
| | | | H01L 23/49822 |

* cited by examiner

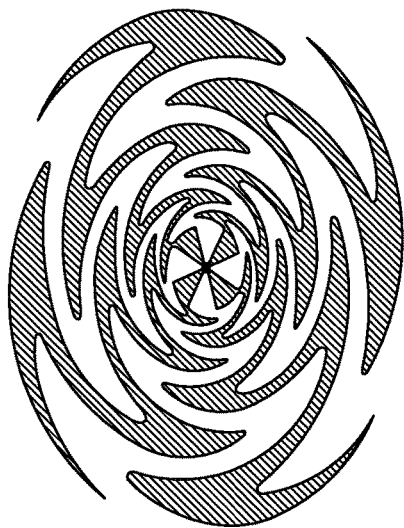
FIG. 6
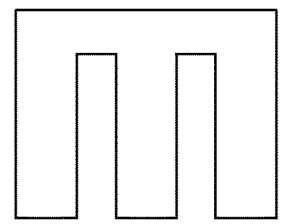
FIG. 8
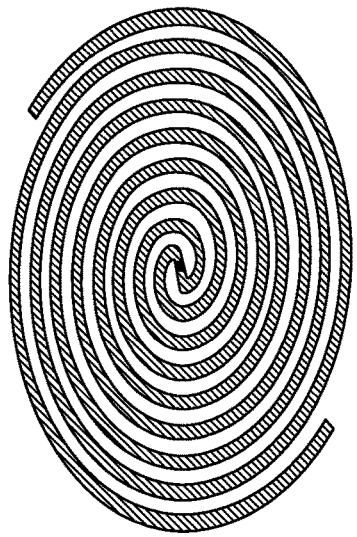
FIG. 5
FIG. 7

ANTENNA ASSEMBLY FOR WAFER LEVEL PACKAGING

BACKGROUND

Field

This disclosure relates generally to packaging, and more specifically, to an integrated antenna assembly for wafer level packaging.

Related Art

The packaging of integrated circuit die that operate at radio frequencies, such as frequencies measured in millimeters, may result in signal insertion loss and electromagnetic interference. In addition, while reducing the size of electronic systems is a common goal amongst electronics manufacturers, doing so may increase the complexity of systems for a given performance as a result of the reduced size. Further, increasing the complexity of systems often increases the packaging costs of such systems.

BRIEF DESCRIPTION OF THE DRAWINGS

The present invention may be better understood, and its numerous objects, features, and advantages made apparent to those skilled in the art by referencing the accompanying drawings.

FIG. 5-8 illustrate block diagrams depicting example antenna structures utilized in a packaged semiconductor device, according to some embodiments.

The present invention is illustrated by way of example and is not limited by the accompanying figures, in which like references indicate similar elements, unless otherwise noted. Elements in the figures are illustrated for simplicity and clarity and have not necessarily been drawn to scale.

DETAILED DESCRIPTION

The following sets forth a detailed description of various embodiments intended to be illustrative of the invention and should not be taken to be limiting.

Overview

Often, an antenna is attached to a backside of a radio frequency (RF) packaged device, allowing a printed circuit board (PCB) to be attached to the front side of the RF packaged device. Such a configuration requires the use of backside contact technology, such as placing vias through a mold body of the RF packaged device in order to convey a signal between the backside and the front side. Such technology increases the distance traveled by a signal between the antenna and a die included in the RF packaged device, which on average is 300 to 650 microns. As a result, signal noise is introduced, which is especially detrimental for sensitive RF packaged devices that operate at millimeter-wave frequencies.

The present disclosure provides an integrated antenna assembly that reduces antenna signal loss by reducing the path traveled by the signal between the die and the antenna for wafer level packaging (WLP), such as fan-out wafer level packaging (FOWLP). The integrated antenna assembly is a packaged device that includes a printed circuit board (PCB) attached to a front side of a package substrate, which includes an embedded die. An antenna enabling element, such as an antenna structure, a surface mount device (SMD) connector, or even another packaged device that may include an antenna, is also attached to the front side of the package substrate within a cavity of the PCB. Placement of the antenna enabling element on the front side of the package substrate (which may also be characterized as the active side of the packaged device) shortens the signal path distance between the antenna enabling element to the die, which on average is 20 to 100 microns, depending on the number of metal layers used in the packaged device. The present disclosure is especially beneficial in FOWLP due to the short distance between an embedded die and the front side of the package substrate, which on average is 20 microns, while also providing a larger available area of the package substrate in which the antenna enabling element may be placed. The present disclosure also reduces package processing cost significantly, as there is no need for backside contact technology.

Example Embodiments

Figure 1:
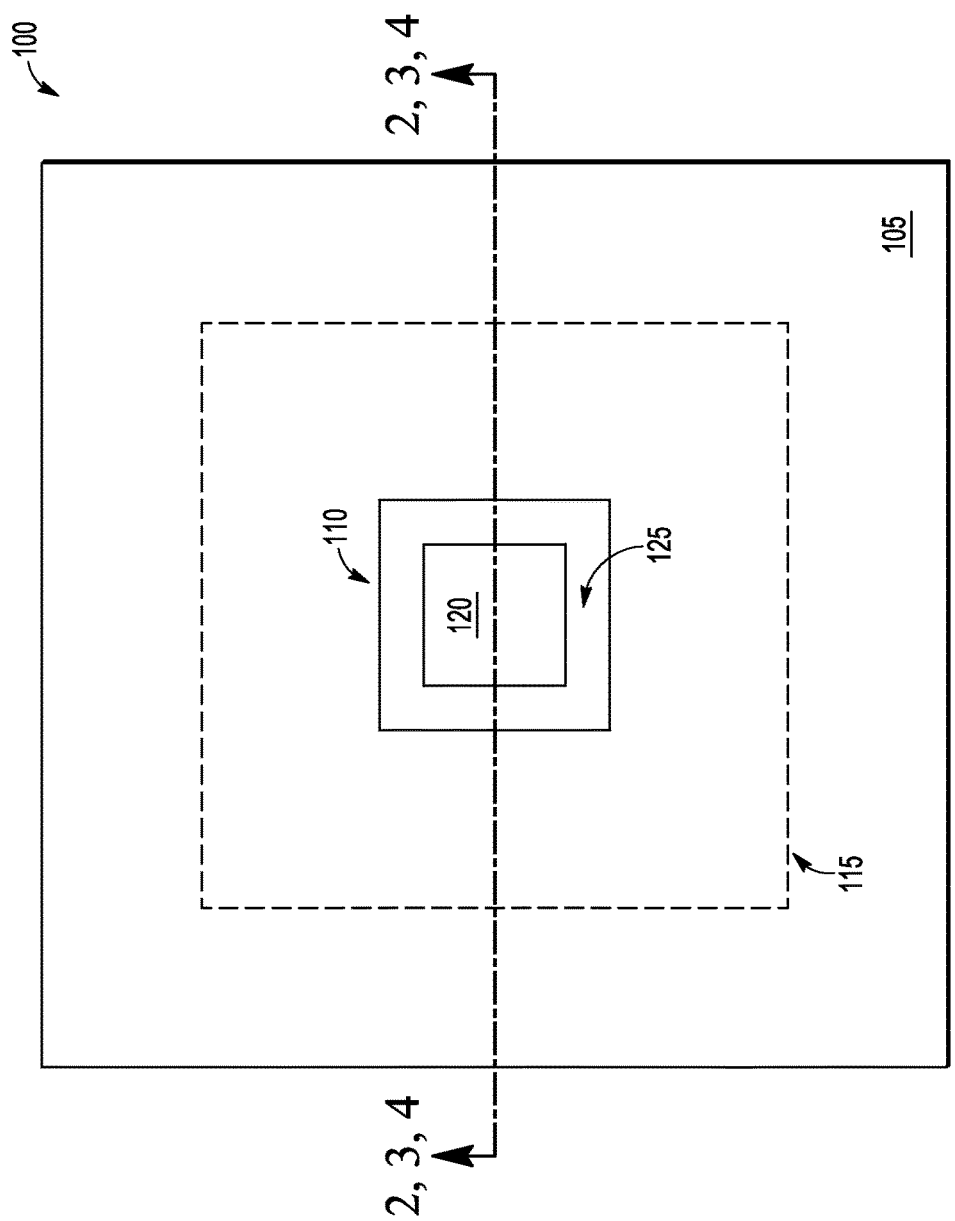
FIG. 1 illustrates a block diagram depicting a top-down view of an example packaged semiconductor device in which the disclosure is implemented, according to some embodiments.

FIG. 1 illustrates a block diagram depicting a top-down view of an example packaged semiconductor device 100 in which the disclosure is implemented. Device 100 includes a printed circuit board (PCB) 105 having an opening 110 through PCB 105 that forms a cavity or void within PCB 105, where opening 110 extends from a top side (as shown in FIG. 1) of PCB 105 to an opposing bottom side of PCB 105. Examples of the PCB 105 include, but are not limited to: a single sided printed circuit board, a double-sided printed circuit board, a multi-layered printed circuit board, and the like. PCB 105 may also include various active and passive components. PCB 105 may provide power connections for the packaged semiconductor device 100, such as ground and various supply voltages. The bottom side of PCB 105 is an active side of PCB 105. In some embodiments, both the top and bottom sides of PCB 105 are active sides. In some embodiments, multiple inner and outer sides of PCB 105 are active sides.

Device 100 also includes a package substrate 125 (as outlined by the broken line of perimeter 115) underlying the PCB 105 and exposed through opening 110. The bottom (active) side of PCB 105 is attached to a front side of package substrate 125 using PCB connections such as solder balls, solder bumps, solder paste, studs, and the like. The front side of package substrate 125 is an active side of package substrate 125 and is facing up in the orientation illustrated in FIG. 1. Package substrate 125 includes an integrated circuit die embedded within the package substrate 125, also referred to as an embedded die. The embedded die is configured to receive, to transmit, or to receive and to transmit, a radio frequency (RF) signal, which may have a frequency measured in millimeters. Package substrate 125 also includes embedded interconnects between an active side of the embedded die and the front side of package substrate 125. Examples of a package substrate include, but are not limited to, a wafer level chip scale package, a fan out wafer level package, and the like. Package substrate 125 is further described below in connection with FIG. 2.

Device 100 also includes an antenna enabling element 120 that is attached to the front side of package substrate 125 within opening 110 of PCB 105. Antenna enabling element 120 may be attached to package substrate 125 using device connections such as solder balls, solder bumps, solder paste, studs, and the like. Antenna enabling element 120 is an element that enables the RF signal to be conveyed between an antenna and the integrated circuit die embedded in package substrate 125 through the cavity or opening 110 in PCB 105. Examples of antenna enabling element 120 include, but are not limited to, an antenna structure, an antenna that is printed, plated, or deposited on the front side of package substrate 125, a connector or socket such as a surface mounted device (SMD) connector or socket that conveys the signal between an antenna connected to the connector and the embedded die, another packaged device such as a ball grid array (BGA) package or land grid array (LGA) package that may include an antenna, an inductor or loading coil connected to an antenna, and the like. By conveying the RF signal through the opening 110 in PCB 105, device 100 provides a shorter signal path from the embedded die to an antenna in order to minimize signal loss. Various examples of antenna enabling element 120 are further discussed below in connection with FIG. 2-4, where cross-sectional views of such examples are taken at broken line 2, 3, 4.

In the embodiment shown, opening 110 is formed in PCB 105 in a centered position (e.g., equilateral or equidistant from the edges of PCB 105). In other embodiments, opening 110 may be formed elsewhere in PCB 105, such as off-centered or otherwise formed within PCB 105 to provide a cavity within which an antenna enabling element 120 is placed. In the embodiment shown, opening 110 is in the shape of a square, but may also be otherwise shaped in other embodiments, such as rectangular, polygonal, circular, oval, amorphous, and the like. Opening 110 may be sized as a percentage of the footprint area of PCB 105 (or the area within the perimeter of the edges of PCB 105). For example, opening 110 may occupy up to 60% of the footprint area occupied by PCB 105, since fewer connections are needed between the package substrate and PCB, such as connections for power supply and ground voltages, an HDMI (High Definition Multimedia Interface), and the like. In some embodiments, opening 110 occupies 5% of the PCB footprint area, while in other embodiments, opening 110 occupies 10%, while in still other embodiments, opening 110 occupies 20%. In some embodiments, the connector or socket size is within a range of 2 to 8 mm. In embodiments where opening 110 is completely surrounded by PCB 105 (e.g., on all four sides), opening 110 is large enough for the entirety of antenna enabling element 120 to fit within the opening 110. In other embodiments where opening 110 is not completely surrounded by PCB 105 (e.g., on three sides or fewer), opening 110 is large enough for at least a portion of antenna enabling element 120 to fit within opening 110.

In the embodiment shown, opening 110 is surrounded by the PCB 105 on all four sides in order to ensure structural integrity of the PCB 105, although other embodiments may form opening 110 on one or more edges of the PCB 105 like a notch (e.g., opening 110 is surrounded by PCB 105 on three sides if formed on an edge of PCB 105 or on two sides if formed in a corner of PCB 105). Package substrate 125 is positioned under PCB 105 to underlie at least part of opening 110 within which antenna enabling element 120 is placed, in order to provide enough area on the front side of package substrate 125 for attachment of antenna enabling element 120. In some embodiments, the integrated circuit die embedded in package substrate 125 may also be positioned within the package substrate 125 to be closer to or to underlie at least part of opening 110 in which antenna enabling element 120 is placed in order to shorten the signal path.

Figure 2:
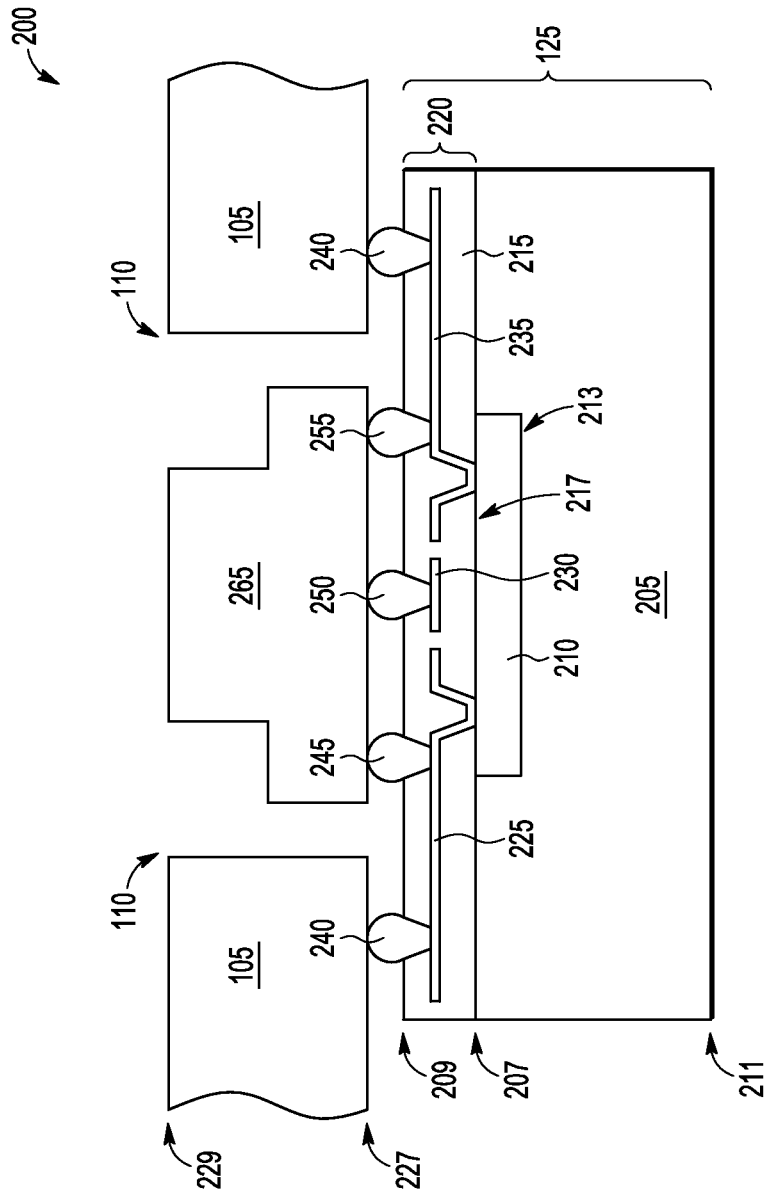
FIG. 2-4 illustrate block diagrams depicting cross-sectional views of example packaged semiconductor devices in which the disclosure is implemented, according to some embodiments.

While antenna enabling element 120 may be somewhat limited in size in order to fit within opening 110, the antenna enabling element 120 may be larger than the embedded die, and opening 110 may also be larger than the embedded die (e.g., as shown in FIG. 2). In the embodiment shown, the antenna enabling element 120 is also smaller than device 100, remaining within the perimeter of opening 110. In some embodiments, an antenna may further be placed on the front side of device 100 (e.g., over PCB 105) and connected to antenna enabling element 120 (e.g., antenna enabling element 120 being an SMD connector). In such embodiments, the antenna over PCB 105 would also be smaller than device 100, remaining within the perimeter of the edges of PCB 105. Also in the embodiment shown, package substrate 125 has a surface area larger than the area within opening 110, in order to provide enough area on the front side of package substrate 125 for attachment of PCB connections to PCB 105, as further discussed below. In other embodiments, package substrate 125 has a surface area smaller than the area within opening 110, as further discussed below in connection with FIG. 9.

Figure 9:
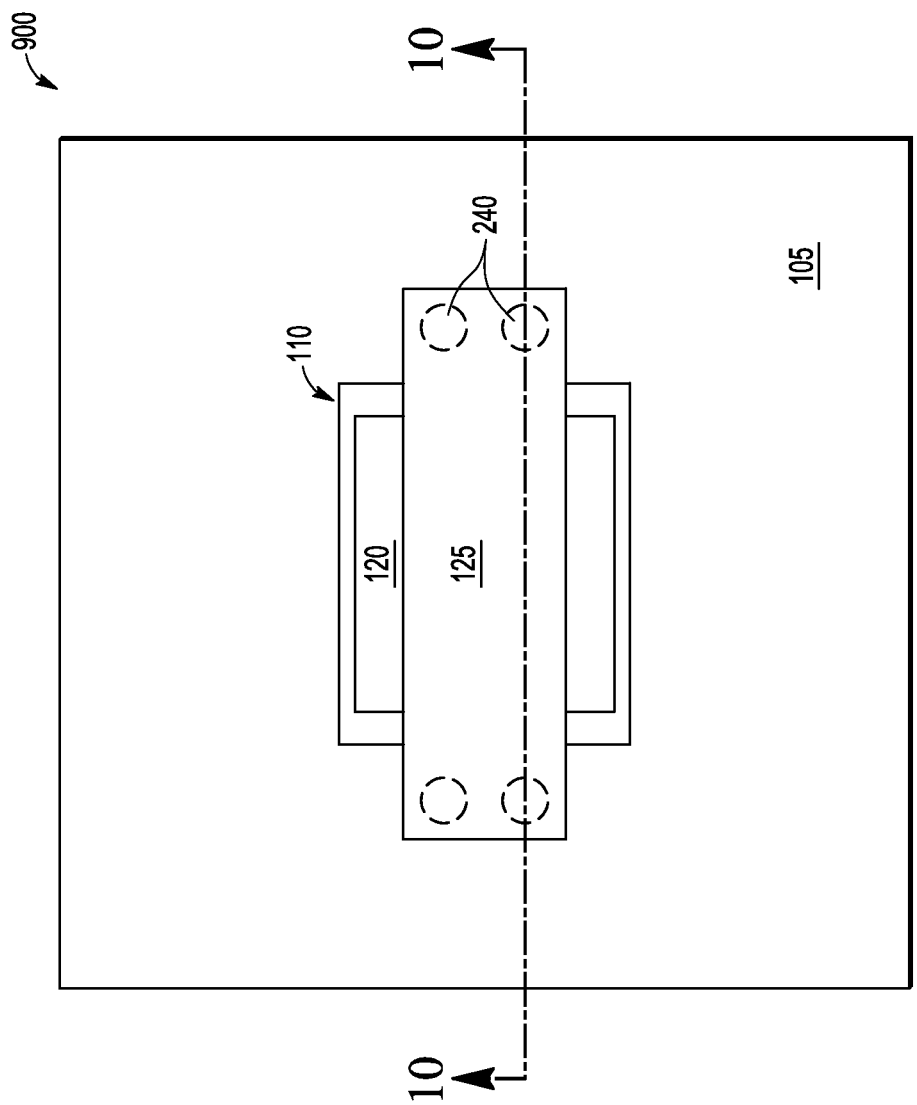
FIG. 9 illustrates a block diagram depicting a top-down view of another example packaged semiconductor device in which the disclosure is implemented, according to some embodiments.
Figure 10:
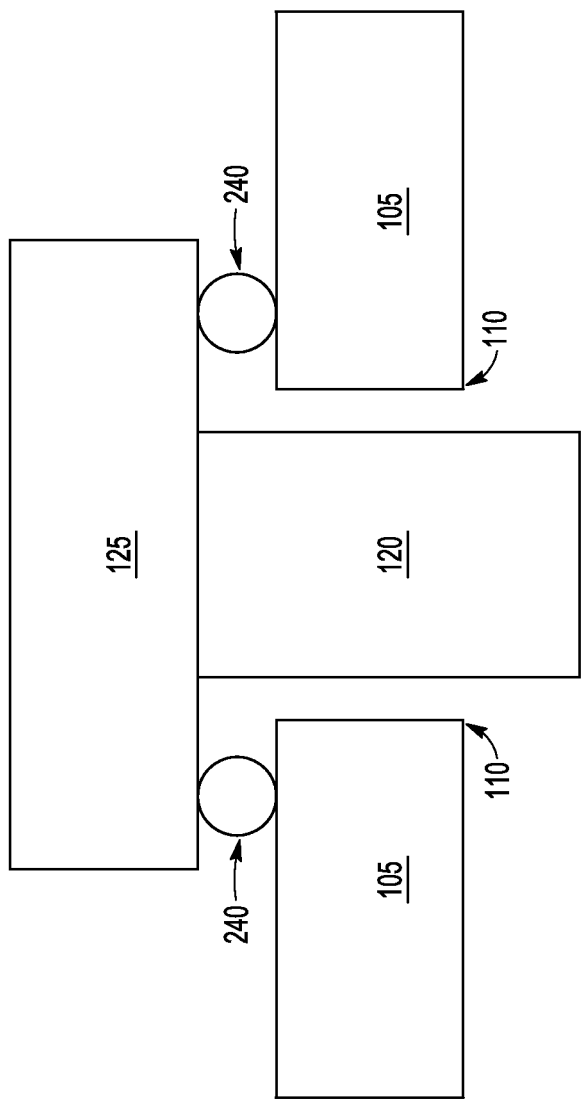
FIG. 10 illustrates a block diagram depicting a cross-sectional view of an example packaged semiconductor device in which the disclosure is implemented, according to some embodiments.

FIG. 9 illustrates a block diagram depicting a top-down view of an example packaged semiconductor device 900 in which the disclosure is implemented. In some embodiments, a PCB with a shielded or RF transmit/receive structure may be placed directly on top or partially on top of the antenna enabling element 120 for improved signal transmission, as shown in FIGS. 9 and 10, which include components that have been previously discussed above in connection with FIG. 1, as indicated by components having a same reference number from FIG. 1. Package substrate 125 includes an embedded die that in turn includes an RF transmit/receive structure. Package substrate 125 is attached to a top side of PCB 105, which is also an active side of PCB 105, by a number of PCB connections 240. It is noted that although four PCB connections 240 (one in each corner of package substrate 125) are used to attach package substrate 125 to PCB 105 in the embodiment shown, more or fewer than four PCB connections 240 may be used in other embodiments. For example, only two PCB connections 240 may be utilized in two corners of package substrate 125 (for a total of two corners, one connection in each corner) in some embodiments, which achieves a same package standoff from the PCB as the four PCB connections 240. In some embodiments, PCB 105 has a thickness within a range of 1.6 mm to 3 mm.

It is noted that in the embodiment shown, package substrate 125 has a surface area smaller than the area within opening 110, where package substrate 125 is positioned over the opening 110 and at least a portion of package substrate 125 overlies the PCB in order to provide enough area on the front side of package substrate 125 for attachment of PCB connections to PCB 105. While package substrate 125 is shown as being centered over the opening 110, package substrate 125 may be offset over opening 110, such as being closer to one side or another of opening 110. Antenna enabling element 120 is attached to the front side of the package substrate 125, where the front side of the package substrate 125 is facing down in the orientation illustrated in FIG. 9. In the embodiment shown, at least a portion of the antenna enabling element 120 is wider than the package substrate 125 and is exposed within the opening 110 on either side of the package substrate 125, although the antenna enabling element 120 may have different sizes in other embodiments. In some embodiments, a shielding layer may be formed on portions of the front side of package substrate 125 before the package substrate 125 is attached to the PCB 105. An example shielding layer is further discussed below in connection with FIG. 3. A cross-sectional view of packaged semiconductor device 900 at broken line 10 is illustrated in FIG. 10.

FIG. 10 illustrates a block diagram depicting a cross-sectional view of packaged semiconductor device 900. As shown, package substrate 125 is attached to a top side of PCB 105 by PCB connections 240. Antenna enabling element 120 is attached to a front side of the package substrate 125, where the front side of the package substrate 125 is facing down in the orientation illustrated in FIG. 10. Antenna enabling element 120 extends through the opening 110 within PCB 105. It is noted that antenna enabling element 120 extends past the bottom side of PCB 105, indicating that antenna enabling element 120 need not be coplanar with the bottom side of PCB 105. An example of antenna enabling element 120 includes a connector or socket (such as an SMD connector or socket) that extends past the bottom side of PCB 105. Another example of antenna enabling element 120 includes a tubular antenna that extends past the bottom side of PCB 105.

FIG. 2 illustrates a block diagram depicting a cross-sectional view of an example packaged semiconductor device 200 in which the disclosure is implemented. FIG. 2 includes components that have been previously discussed above in connection with FIG. 1, as indicated by components having a same reference number from FIG. 1.

Device 200 includes PCB 105, package substrate 125, and antenna enabling element 265 that is a connector or socket, such as an SMD connector, a transmission line, and the like. PCB 105 has a top side 229 (which is illustrated in the top-down view of FIG. 1) and a bottom side 227 that opposes top side 229, where bottom side 227 is also an active side of PCB 105. In some embodiments, top side 229 may also be an active side (e.g., double sided PCB). In some embodiments, PCB 105 has a thickness within a range of 1.6 mm to 3 mm. Package substrate 125 has a front side 209 and a backside 211 that opposes front side 209, where the front side 209 is facing up in the orientation illustrated in FIG. 2. A portion of front side 209 is exposed within opening 110. The bottom side 227 of PCB 105 is attached to the front side 209 of package substrate 125 by a number of PCB connections 240. PCB connections 240 are illustrated as solder balls in FIG. 2, although other types of connections may be used. Antenna enabling element 265 is also attached to the front side 209 of package substrate 125 within opening 110 by a number of device connections, such as 245, 250, and 255. Device connections 245, 250, and 255 are illustrated as solder balls in FIG. 2, although other types of connections may be used.

Package substrate 125 includes an embedded die 210, which is also referred to as die 210. Die 210 is a semiconductor die that may include circuits implemented using silicon, silicon-germanium, gallium arsenide, silicon nitride, and the like. Die 210 includes active and passive components, such as transistors, resistors, and capacitors, and the like. In some embodiments, die 210 includes a receiver or a receiver portion of a transceiver configured to demodulate a radio frequency (RF) signal received at die 210 to extract information, such as base-band information. The RF signal may be received from an antenna and have a frequency measured in millimeters (mmwave). In some embodiments, die 210 includes a transmitter or a transmitter portion of a transceiver configured to modulate information, such as base-band information, onto an RF signal to be provided to an antenna. Die 210 is configured to process the RF signal, such as by modulating an outgoing RF signal or demodulating an incoming RF signal. Die 210 may also include one or more of an integrated phase-locked loop (PLL), a power amplifier, a local oscillator (LO), an on-chip ramp generator, and the like.

Package substrate 125 also includes a package body 205 in which die 210 is embedded. Package body 205 surrounds a backside 213 of die 210, where an active side 217 of die 210 is exposed in a surface 207 of package body 205. In other words, the active side 217 of die 210 is coplanar with the surface 207 of package body 205. Package body 205 may be formed from one or more layers of an encapsulant material, such as mold compound like an epoxy resin, polymeric material, and the like.

Package substrate 125 also includes buildup layers 220, which includes dielectric layers and conductive layers that are formed over die 210 and package body 205 (which may also be characterized as formed over active side 217 and surface 207) to form interconnects (like 225, 230, and 235) between the active side 217 of die 210 and the front side 209 of package substrate 125. Interconnects, such as interconnects 225, 230, and 235, are formed from a conductive material having suitable conductivity properties for circuitry, such as a metal that includes copper, gold, silver, aluminum, and the like. Buildup layers 220 can be characterized as being proximal to, or located closest to, the active side 217 of die 210. Since buildup layers 220 are proximal to the active side 217, buildup layers 220 can also be characterized as being distal from, or located farthest from, the backside 213 of die 210. Package body 205 can be characterized as being proximal to the backside 213 of die 210.

In the embodiment shown, each interconnect is connected to a contact area (e.g., pad) on the active side 217 of die 210 and is covered with (or embedded in) dielectric material 215. Dielectric material 215 is a semiconductor material having suitable electrical insulating properties, such as silicon oxide, nitride, polyimide, and the like. For example, one or more layers of dielectric material 215 may be conformally deposited over the surface of 207 and active side 217 of die 210. One or more openings are made in the deposited dielectric material 215 to expose the contact areas of the die 210, such as by a patterning and etching process. A layer of conductive material may then be deposited over the dielectric material 215, including within the openings to make contact with the exposed contact areas of die 210. The conductive material is then patterned and etched to form one or more interconnects, such as interconnect 225. One or more additional layers of dielectric material 215 may then be deposited over the interconnects. Portions of the interconnect are exposed within one or more openings in dielectric material 215, which form one or more external contact areas on the front side 209 of package substrate 125 in which a PCB connection (such as 240) or a device connection (such as 245) may be placed.

Deposition of the buildup layers 220, which includes layers of dielectric material 215 and conductive material, may be performed using a deposition process, including but not limited to one or more of chemical vapor deposition (CVD), plasma enhanced CVD (PECVD), physical vapor deposition (PVD), atomic layer deposition (ALD), sputtering, evaporation, electrochemical deposition, electroless chemical deposition, ink jet deposition, and the like. It is also noted that patterning and etching of the buildup layers 220 (e.g., etching dielectric material 215 layers and conductive material layers to form interconnects) discussed herein may utilize one or more of a number of patterning and etching processes, including but not limited to photoresist or hard mask formation, wet etch, dry etch using reactive ion etch process, sputter etch, vapor phase etch, and the like. Any remaining etch mask or photoresist layers are stripped or removed.

In the embodiment shown, the interconnects are formed in a layout for a fan out wafer level package (e.g., interconnects extend beyond a perimeter of die 210). In other embodiments, the interconnects may be formed in a layout for a wafer level chip scale package (e.g., the interconnects remain within a perimeter of die 210). Although three interconnects are illustrated, a different number of interconnects may be implemented, according to the input/output (I/O) needs of die 210. As the I/O needs of the die 210 increase, the size of the package substrate also increases in order to provide enough space for external contact areas and interconnect routing. The present disclosure is especially beneficial for sensor-type packages having low I/O needs.

In the embodiment shown, antenna enabling element 265 is attached to the front side 209 of package substrate 125 within opening 110 by device connections 245, 250, and 255, that make contact with interconnects 225, 230, and 235. Antenna enabling element 265 (as well as other embodiments of the antenna enabling element like 120, 365, and 465) can be characterized as being proximal to the active side 217 of die 210. Similarly, PCB 150 can be characterized as being proximal to the active side 217 of die 210. Also, at least part of PCB 105 is located laterally around antenna enabling element 265, such as on two sides of antenna enabling element 265 and up to and including surrounding all sides of antenna enabling element 265. It is also noted that although FIG. 2 (and FIG. 3) illustrate antenna enabling element 265 (and 120 and 365) as being coplanar with a top side of PCB 105, antenna enabling element 265 (and 120 and 365) need not be coplanar with the top side of PCB 105.

Figure 3:
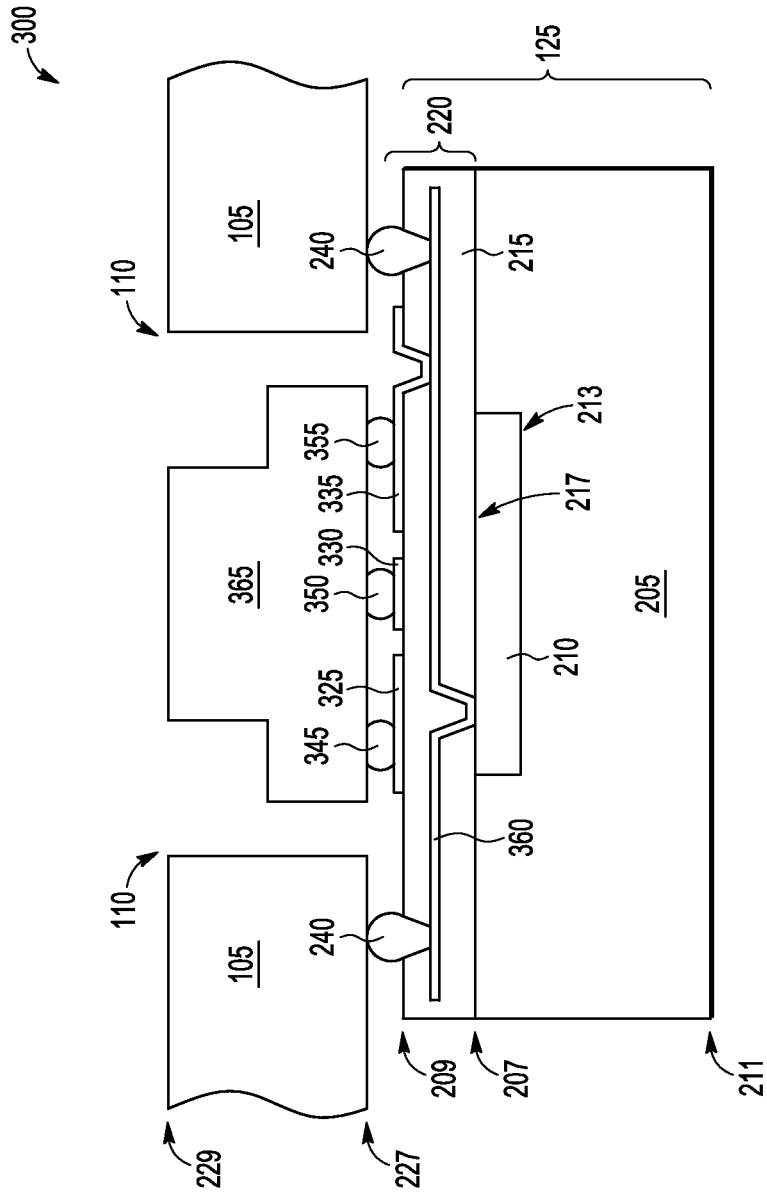

FIG. 3 illustrates a block diagram depicting a cross-sectional view of an example packaged semiconductor device 300 in which the disclosure is implemented. FIG. 3 includes a number of components that have been previously discussed above in connection with FIGS. 1 and 2, as indicated by components having a same reference number from FIGS. 1 and 2.

Device 300 includes PCB 105, package substrate 125, and antenna enabling element 365 that is a structure that includes an antenna. In some embodiments, antenna enabling element 365 is a BGA package device, LGA package device, and the like, which may include an antenna. In other embodiments, antenna enabling element 365 is a dedicated antenna structure that includes an antenna. Examples of antennas include but are not limited to a patch antenna, a microstrip antenna, an aperture antenna, and the like. Antenna enabling element 365 is attached to the front side 209 of package substrate 125 within opening 110 by a number of device connections, such as 345, 350, and 355. Device connections 345, 350, and 355 are illustrated as solder bumps in FIG. 3, although other types of connections may be used.

Interconnects, such as interconnects 360, 325, 330, and 335, are formed from dielectric layers and conductive layers of build up layers 220 over die 210 and package body 205 in a manner similar to interconnects 225, 230, and 235 discussed above in connection with FIG. 2. Each interconnect is connected to a contact area (e.g., pad) on the active side 217 of die 210, either directly or through another interconnect. For example, interconnect 360 is shown as having a direct connection to the active side 210 of die 210, where interconnect 360 is covered with dielectric material 215. One or more openings are made in the dielectric material 215 to expose one or more external contact areas on the front side 209 of package substrate 125 in which a PCB connection (like 240) may be placed. As another example, interconnect 335 is shown as making contact with interconnect 360 through an opening in an upper portion of dielectric material 215.

However, in the embodiment shown in FIG. 3, a top conductive layer of buildup layers 220 (such as M2 or metal layer 2) is not covered with dielectric material 215, but instead is left exposed. It is noted that there is no passivation layer formed over the exposed top conductive layer. In some embodiments, the exposed conductive layer is used to form interconnects having external contact areas (like 325, 330, and 335) on which device connections (like 345, 350, and 355) can be placed. Interconnects formed from portions of the exposed conductive layer are located within opening 110, where external contact areas of the interconnects are located underneath antenna enabling element 365. It is noted that device connections 345, 350, 355 are illustrated using solder bumps, allowing both solder bumps and solder balls (of PCB connections 240) to be used on the front side 209 of package substrate 125.

In some embodiments, the exposed conductive layer is used to form a shielding or grounding layer for package substrate 125, where the exposed conductive layer is connected to ground. In some embodiments, the exposed conductive layer is used to form an RF transmission and receipt line for package substrate 125, where the exposed conductive layer is connected to a signal pad of package substrate 125. In some embodiments, portions of the exposed conductive layer are used to form one or more of a shielding/grounding layer, an RF transmission and receipt line, and interconnects having external contact areas. A shielding or grounding layer formed from the exposed conductive layer is similarly located underneath antenna enabling element 365 and over die 210, where the shielding or grounding layer is located around and separated from any external contact areas of the interconnects for antenna enabling element 365, or from an RF transmission and receipt line.

Figure 4:
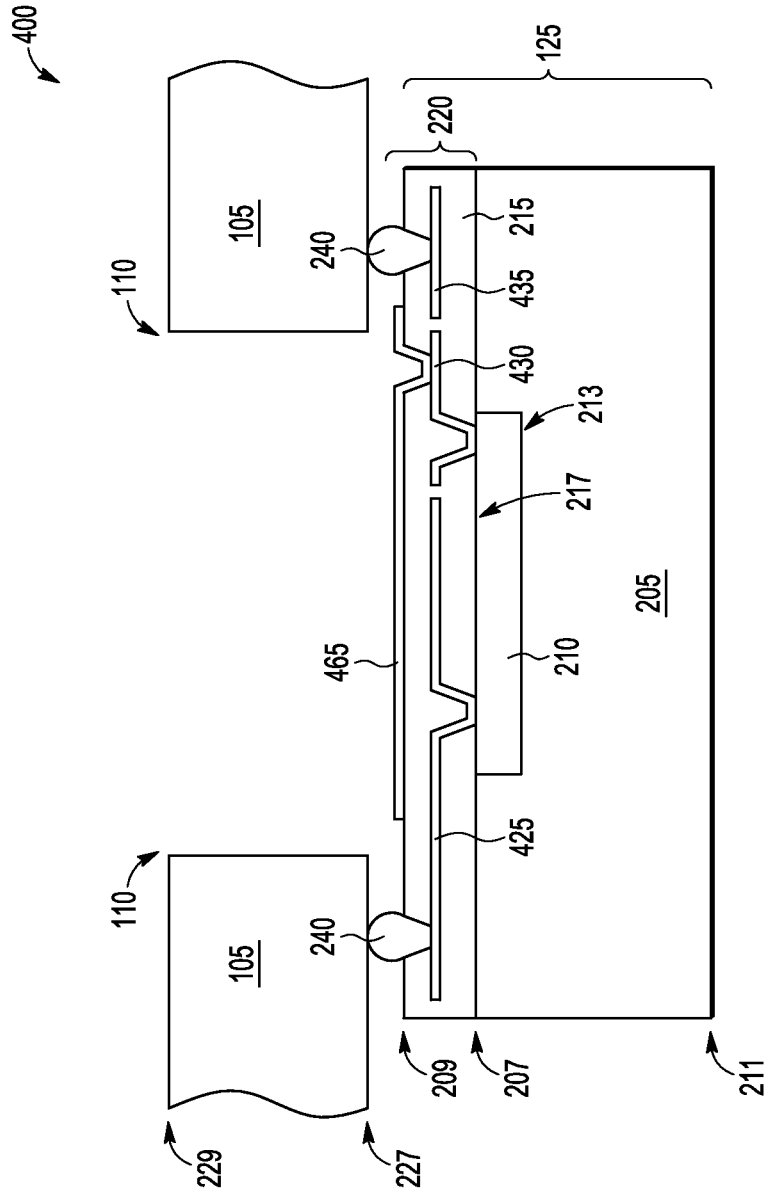

FIG. 4 illustrates a block diagram depicting a cross-sectional view of an example packaged semiconductor device 400 in which the disclosure is implemented. FIG. 4 includes a number of components that have been previously discussed above in connection with FIGS. 1 and 2, as indicated by components having a same reference number from FIGS. 1 and 2.

Device 400 includes PCB 105, package substrate 125, and antenna enabling element 465 that is an antenna formed on the front side 209 of package substrate 125. In the embodiment shown, antenna enabling element 465 is formed from an exposed conductive layer of buildup layers 220. The exposed conductive layer (and the antenna enabling element 465 itself) may be formed by printing (e.g., ink jet deposition), plating (e.g., electrochemical deposition or electroless chemical deposition), or otherwise depositing (as discussed above) conductive material on the front side 209 of package substrate 125. Antenna enabling element 465 may also be further formed by a patterning and etching process (as discussed above). Antenna enabling element 465 makes contact with interconnect 430, which in turn makes contact with the active side 217 of die 210. Example shapes of antenna enabling element 465 are provided in FIG. 5-8. Buildup layers 220 may also include one or more conductive layers that form other interconnects, such as interconnects 425 and 435.

FIG. 5-8 illustrate block diagrams depicting example simplified antenna structures, which are not to limit the shape of the antenna utilized in the present disclosure. An antenna utilized in a packaged semiconductor device (like device 400) may have any geometric shape, including but not limited to circular, rectangular, polygonal, oval, amorphous, and the like. An antenna may be formed from the conductive material used to form interconnects within buildup layers 220, or may be another conductive material including but not limited to copper, gold, silver, aluminum, stainless steel, and the like (e.g., the antenna may be formed from a conductive material different from the conductive material used to form the embedded interconnects of the package substrate). FIG. 5 illustrates an antenna having antenna elements that spiral outward from the center of the antenna. FIG. 6 illustrates an antenna having antenna elements that extend in a "zig zag" pattern outward from the center of the antenna. FIG. 7 illustrates an antenna having an antenna element in a rectangular shape. FIG. 8 illustrates an antenna having three antenna arm elements extending from a central antenna element.

By now it should be appreciated that there has been provided an integrated antenna assembly that reduces antenna signal loss by reducing the path traveled by the signal between the die and the antenna for wafer level packaging (WLP).

In one embodiment of the present disclosure, a packaged semiconductor device is provided, which includes a package substrate including an embedded die configured to process a radio frequency (RF) signal; a printed circuit board (PCB) attached to a front side of the package substrate, wherein the PCB includes a cavity; and an antenna enabling element attached to the front side of the package substrate within the cavity, the antenna enabling element configured to convey the RF signal through the cavity.

One aspect of the above embodiment provides that the antenna enabling element includes a connector for an antenna.

Another aspect of the above embodiment provides that the antenna enabling element includes a structure that includes an antenna, the structure including one of a group including a ball grid array (BGA) package, a land grid array (LGA) package, and a dedicated antenna structure.

Another aspect of the above embodiment provides that the antenna enabling element includes an antenna, the antenna including one of a group including a patch antenna, a microstrip antenna, and an aperture antenna.

Another aspect of the above embodiment provides that the package substrate further includes: embedded interconnects between the embedded die and the front side of the package substrate, wherein the embedded interconnects are formed in a layout for a fan out wafer level package (FOWLP).

Another aspect of the above embodiment provides that the antenna enabling element extends through at least a portion of the PCB.

Another aspect of the above embodiment provides that the package substrate includes a plurality of buildup layers over the embedded die, and the plurality of buildup layers includes a top conductive layer that is exposed on the front side of the package substrate.

A further aspect of the above embodiment provides that the antenna enabling element is attached to the front side of the package substrate by a plurality of connections placed on interconnects formed from portions of the top conductive layer.

Another further aspect of the above embodiment provides that a shielding layer is formed from the top conductive layer on the front side of the package substrate, the shielding layer located between the antenna enabling element and the embedded die.

Another aspect of the above embodiment provides that a frequency of the RF signal is measured in millimeters.

In another embodiment of the present disclosure, a radio frequency (RF) semiconductor device is provided, which includes a printed circuit board (PCB) having an opening that extends through the PCB; a package substrate attached to the PCB, the package substrate positioned to expose an active side of the package substrate within the opening of the PCB; and an antenna enabling element attached to the active side of the package substrate within the opening, the antenna enabling element configured to convey an RF signal through the opening.

One aspect of the above embodiment provides that the package substrate includes an embedded die.

A further aspect of the above embodiment provides that the embedded die is positioned within the package substrate to underlie the opening.

Another aspect of the above embodiment provides that the opening is positioned on an edge of the PCB.

Another aspect of the above embodiment provides that the opening is positioned in a corner of the PCB.

Another aspect of the above embodiment provides that the active side of the package substrate includes one or more openings in a dielectric material to form one or more external contact areas.

A further aspect of the above embodiment provides that the active side of the package substrate further includes one or more portions of an exposed conductive layer over the dielectric material to form one or more additional external contact areas.

In another embodiment of the present disclosure, a packaged semiconductor device is provided, which includes: an integrated circuit die configured to process a radio frequency (RF) signal; an antenna enabling element coupled to an active side of the integrated circuit die, the antenna enabling element located proximal to the active side of the integrated circuit die; and a printed circuit board (PCB) having a first side coupled to the active side of the integrated circuit die, the PCB located proximal to the active side of the integrated circuit die, at least a portion of the PCB located laterally to the antenna enabling element, and the antenna enabling element configured to convey the RF signal between the first side of the PCB to a second side of the PCB that opposes the first side.

One aspect of the above embodiment provides that the integrated circuit die is embedded within a package substrate, the package substrate having a front side located proximal to the active side of the integrated circuit die.

A further aspect of the above embodiment provides that the package substrate includes a package body that is located proximal to a backside of the integrated circuit die, the package body surrounds the backside of the integrated circuit die.

The circuitry described herein may be implemented on a semiconductor substrate, which can be any semiconductor material or combinations of materials, such as gallium arsenide, silicon germanium, silicon-on-insulator (SOI), silicon, monocrystalline silicon, the like, and combinations of the above.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

As used herein the terms "substantial" and "substantially" mean sufficient to accomplish the stated purpose in a practical manner and that minor imperfections, if any, are not significant for the stated purpose.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A radio frequency (RF) semiconductor device comprising:
   a package substrate comprising:
      an embedded die configured to process a radio frequency (RF) signal, and
      embedded interconnects between an active side of the embedded die and a front side of the package substrate, wherein the embedded interconnects have contact areas exposed at the front side of the package substrate;
   a printed circuit board (PCB) having a first side and a second side that opposes the first side, wherein the PCB includes a cavity that extends from the first side to the second side of the PCB,
      wherein the first side of the PCB is attached to the front side of the package substrate by a plurality of solder connections that are attached to a first subset of the contact areas of the embedded interconnects exposed at the front side of the package substrate, and
      wherein the PCB is configured to:
         provide ground to the embedded die through a first solder connection of the plurality of solder connections, and
         provide a power supply voltage to the embedded die through a second solder connection of the plurality of solder connections; and
   an antenna enabling element attached to the front side of the package substrate within the cavity, the antenna enabling element configured to convey the RF signal through the cavity between the first side and the second side of the PCB.

2. The RF semiconductor device of claim 1, wherein the antenna enabling element comprises a connector for an antenna.

3. The RF semiconductor device of claim 1, wherein the antenna enabling element comprises a structure that includes an antenna, the structure comprising one of a group including a ball grid array (BGA) package, a land grid array (LGA) package, and a dedicated antenna structure.

4. The RF semiconductor device of claim 1, wherein the antenna enabling element comprises an antenna, the antenna comprising one of a group including a patch antenna, a microstrip antenna, and an aperture antenna.

5. The RF semiconductor device of claim 1, wherein
   the active side of the embedded die is proximal to the front side of the package substrate, a backside of the embedded die is proximal to and surrounded by a package body of the package substrate, and
   the embedded interconnects are formed in a layout for a fan out wafer level package (FOWLP).

6. The RF semiconductor device of claim 1, wherein the antenna enabling element extends through at least a portion of the PCB.

7. The RF semiconductor device of claim 1, wherein the package substrate further comprises a plurality of buildup layers over the embedded die that form the embedded interconnects, and the plurality of buildup layers comprises a top conductive layer having portions exposed on the front side of the package substrate to form the contact areas of the embedded interconnects.

8. The RF semiconductor device of claim 7, wherein the antenna enabling element is attached to the front side of the package substrate by another plurality of solder connections that are attached to a second subset of contact areas of the embedded interconnects exposed at the front side of the package substrate.

9. The RF semiconductor device of claim 7, wherein a shielding layer is formed from the top conductive layer on the front side of the package substrate, the shielding layer located between the antenna enabling element and the embedded die.

10. The RF semiconductor device of claim 1, wherein a frequency of the RF signal is measured in millimeters.

11. The RF semiconductor device of claim 1, wherein the embedded die is positioned within the package substrate to underlie the cavity.

12. The RF semiconductor device of claim 1, wherein the cavity is positioned on an edge of the PCB.

13. The RF semiconductor device of claim 1, wherein the cavity is positioned in a corner of the PCB.

14. The RF semiconductor device of claim 1, wherein the front side of the package substrate comprises one or more openings in a dielectric material to form one or more external contact areas.

15. The RF semiconductor device of claim 14, wherein the front side of the package substrate further comprises one or more portions of an exposed conductive layer over the dielectric material to form one or more additional external contact areas.

16. The RF semiconductor device of claim 1, wherein
the antenna enabling element is coupled to the embedded die by a signal path, and
the signal path comprises one or more from a group including solder connections on the front side of the package substrate and embedded interconnects in the package substrate.

17. The RF semiconductor device of claim 16, wherein the signal path between the antenna enabling element and the embedded die is less than 100 microns.

18. The RF semiconductor device of claim 1, wherein the embedded die comprises a transmitter and the RF signal is conveyed from the first side of the PCB to the second side of the PCB through the cavity.

19. The RF semiconductor device of claim 1, wherein the embedded die comprises a receiver and the RF signal is conveyed from the second side of the PCB to the first side of the PCB through the cavity.

20. A packaged semiconductor device comprising:
an integrated circuit die embedded in a package body, wherein the integrated circuit die has an active side exposed in a top surface of the package body, the integrated circuit die is configured to process a radio frequency (RF) signal;
a plurality of buildup layers over and contacting the active side of the integrated circuit die and the top surface of the package body, wherein the plurality of buildup layers form a plurality of embedded interconnects to the integrated circuit die, wherein the plurality of embedded interconnects have contact areas exposed at a top buildup layer;
an antenna enabling element attached to a first subset of contact areas; and
a printed circuit board (PCB) having a first side attached a second subset of contact areas by a plurality of solder connections,
wherein the PCB is configured to:
provide ground to the integrated circuit die through a first solder connection of the plurality of solder connections, and
provide a power supply voltage to the integrated circuit die through a second solder connection of the plurality of solder connections,
wherein at least a portion of the PCB is located laterally to the antenna enabling element, and the antenna enabling element is configured to convey the RF signal between the first side of the PCB and a second side of the PCB that opposes the first side.

21. The packaged semiconductor device of claim 20, wherein the antenna enabling element comprises a structure that includes an antenna, the structure comprising one of a group including a ball grid array (BGA) package, a land grid array (LGA) package, and a dedicated antenna structure.

22. The packaged semiconductor device of claim 20, wherein the antenna enabling element comprises an antenna, the antenna comprising one of a group including a patch antenna, a microstrip antenna, and an aperture antenna.

* * * * *